United States Patent [19]

Seki et al.

[11] 4,051,443
[45] Sept. 27, 1977

[54] DIFFERENTIAL AMPLIFIER

[75] Inventors: Kunio Seki; Yukio Suzuki, both of Tokyo; Yoshio Sakamoto, Kokubunji, all of Japan

[73] Assignee: Hitachi, Ltd., Japan

[21] Appl. No.: 691,100

[22] Filed: May 28, 1976

[30] Foreign Application Priority Data

Oct. 6, 1975  Japan .............................. 50-119765

[51] Int. Cl.² .......................................... H03F 3/45
[52] U.S. Cl. .................................. 330/258; 330/307; 330/261
[58] Field of Search ................. 330/22, 30 D, 38 M, 330/40, 69

[56] References Cited
U.S. PATENT DOCUMENTS 3,840,819  10/1974  Steckler .......................... 330/30 D

*Primary Examiner*—James B. Mullins
*Attorney, Agent, or Firm*—Craig & Antonelli

[57] ABSTRACT

A differential circuit including in a monolithic semiconductor chip a pair of differential amplifying elements having each one electrode connected in common and to a common diode means and respective input and output electrodes, another diode means connected to the output electrode of one of said amplifying elements, one transistor having an input signal electrode connected to one end of said common diode means to allow the passage of a current of half the magnitude of that through said common diode, another transistor having an input signal electrode connected to one end of said another diode means to allow the passage of a current of equal magnitude as that through said another diode means, and an output terminal connected to said one and another transistors.

9 Claims, 11 Drawing Figures $$\frac{I_D}{A_D} = \frac{I_Q}{A_Q}$$

DIFFERENTIAL AMPLIFIER

BACKGROUND OF THE INVENTION

1. Field of the Invention

This invention relates to a differential amplifier, and more particularly to a differential amplifier having a reduced number of circuit elements, and providing an excellent common mode signal rejection ratio (CMRR), and a high operational stability.

2. Description of the Prior Art

Conventionally, such differential amplifiers as shown in FIG. 10 have been known as those having a small number of resistive elements and adapted for integration in a monolithic semiconductor integrated circuit. The details of such a differential amplifier is disclosed in IEEE International Solid State Circuits Conference Digest of Technical Papers, pages 16 to 17, published on Feb. 19, 1969. As shown in FIG. 10, the circuit employs a current source circuit consisting of diode $D_1$ and a pnp-type transistor $Q_3$ as the load for a pair of differential transistors $Q_1$ and $Q_2$. Explaining the operation of such a current source circuit with the circuit as shown in FIG. 11 in which a diode D is connected between the base and the emitter of a transistor Q, if the pn-junction of the diode D and the base-emitter junction of the transistor Q are applied with completely the same forward bias voltage $V_{BE}$ and the diode and the transistor are manufactured by simultaneous impurity diffusion, the V-I characteristics of their pn-junctions are equal to each other and they allow currents of the same current density to flow therethrough. Therefore, letting the base-emitter junction area of the transistor Q be $A_Q$ and the pn-junction area of the diode D be $A_D$, the relation between the emitter current $I_Q$ of the transistor Q and the diode current $I_D$ of the diode D will follow the relation, $$(I_D/A_D) = (I_Q/A_Q)$$

Therefore, in such a type of circuit, when a current source circuit including a diode and a transistor having junction areas of equal size is used as the load for a pair of differential amplifying transistors $Q_1$ and $Q_2$, a differential signal current $\bar{i}_1$ is allowed to flow through the pair of differential transistors $Q_1$ and $Q_2$ in the direction of the arrow and the pn-junction of the diode $D_1$ in said current source circuit is biased by this differential signal current $\bar{i}_1$ to generate a forward voltage $V_{BE}$. The base-emitter of the pnp-type transistor $Q_3$ is biased by this forward voltage $V_{BE}$. Then, since the junction areas of the diode and the transistor are equal to each other, a signal current $\bar{i}_2$ having the equal current value with said differential signal current $\bar{i}_1$ is allowed to flow through said transistor $Q_3$ in the direction of the arrow in the figure. Therefore, at the circuit interconnection P of the differential output connected with the collectors of the transistors $Q_2$ and $Q_3$, a differential output signal current of $2i(= \bar{i}_1 + \bar{i}_2)$ is obtained which is twice as large as the differential output signal of the usual differential amplifier and provides a high gain.

Further, the biasing currents of the differential pair transistors $Q_1$ and $Q_2$ of this differential amplifier are set at constant current values by the constant current source circuit consisting of a resistor R, a diode $D_2$ and a transistor $Q_4$. Therefore, said biasing currents are subjected to no change upon any common mode signals applied to the respective bases (pin 1 and pin 2) of the differential pair transistors $Q_1$ and $Q_2$, enabling the provision of an excellent common mode signal rejection ratio (CMRR). To the differential output circuit interconnection P of said differential amplifier, a current amplifying circuit of the next stage consisting of transistors $Q_5$ and $Q_6$ is connected to supply a signal current which is current-amplified signal of said differential output signal to an output terminal (pin 3).

The conventionally known differential amplifier provided with a next stage current amplifying circuit as described above, however, has such drawbacks that the number of circuit elements is large, i.e. six transistors, two diodes and one resistor (nine in total), and that the cost of the differential amplifier becomes high.

SUMMARY OF THE INVENTION

The present invention is made to solve the above drawbacks and therefore, an object of this invention is to provide a differential amplifier having a smaller number of circuit elements, hence being of low cost, and having an excellent common mode signal rejection ratio (CMRR) and a high operational stability.

Other objects, features and advantages of this invention will become apparent from the following description when taken in conjunction with the accompanying drawings.

DESCRIPTION OF THE PREFERRED EMBODIMENTS

Figure 1:
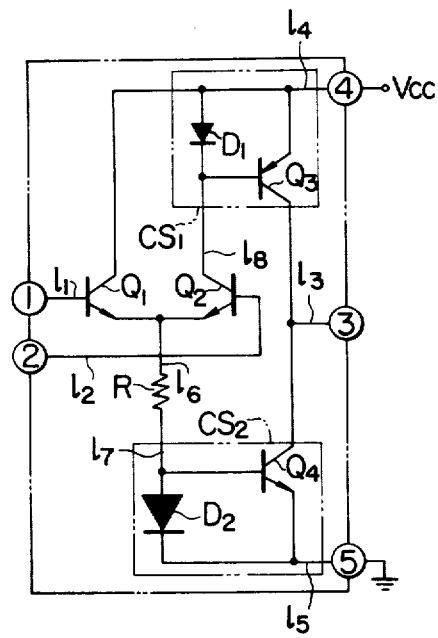
FIGS. 1 and 2 are circuit diagrams of the first and the second embodiments of the differential amplifier according to this invention.

FIG. 1 shows the circuit diagram of a differential amplifier formed in a monolithic semiconductor integrated circuit according to an embodiment of the present invention. In the figure, numerals enclosed in a circle indicate pins (external lead terminals) of the integrated circuit and circuit elements of transistors, diodes and a resistor enclosed in a broken line, are formed in a single silicon semiconductor chip by the well-known integrated circuit manufacturing processes. In this circuit, a differential amplifier is formed of differential pair transistors $Q_1$ and $Q_2$ each having a base electrode, an emitter electrode and a collector electrode, a first source terminal (pin 4 maintained approximately at a constant positive voltage $V_{CC}$), a second source terminal (pin 5 connected to the ground potential), a common resistor R, a first current source $CS_1$ consisting of a first pn-junction diode $D_1$ and a pnp-type first transistor $Q_3$, a second current source $CS_2$ consisting of a second pn-junction diode $D_2$ and an npn-type second transistor $Q_4$ and output means (pin 3: the output terminal) connected to the collector of said first transistor $Q_3$ and to the collector of said second transistor for generating the amplified differential output signal current of the two signals applied to the base electrodes of the differential pair transistors $Q_1$ and $Q_2$. The emitter electrodes of said differential pair transistors $Q_1$ and $Q_2$ are connected commonly to one end of said common resistor R. Said second pn-junction diode $D_2$ is connected between the other end of said common resistor R and said second source terminal (pin 5). Said second transistor $Q_4$ has its base connected to the other end of said common resistor R and its emitter to said grounded second source terminal (pin 5). On the other hand, said first pn-junction diode $D_1$ is connected between the first source terminal (pin 4) and the collector of one of said differential pair transistors $Q_2$. Said first transistor $Q_3$ has its base connected to the collector of said one transistor $Q_2$ and its emitter to the first source terminal (pin 4).

In addition to the above-described features of the circuit connection, this invention has other features in the physical dimensions of the constituent circuit elements as follows.

Figure 3:
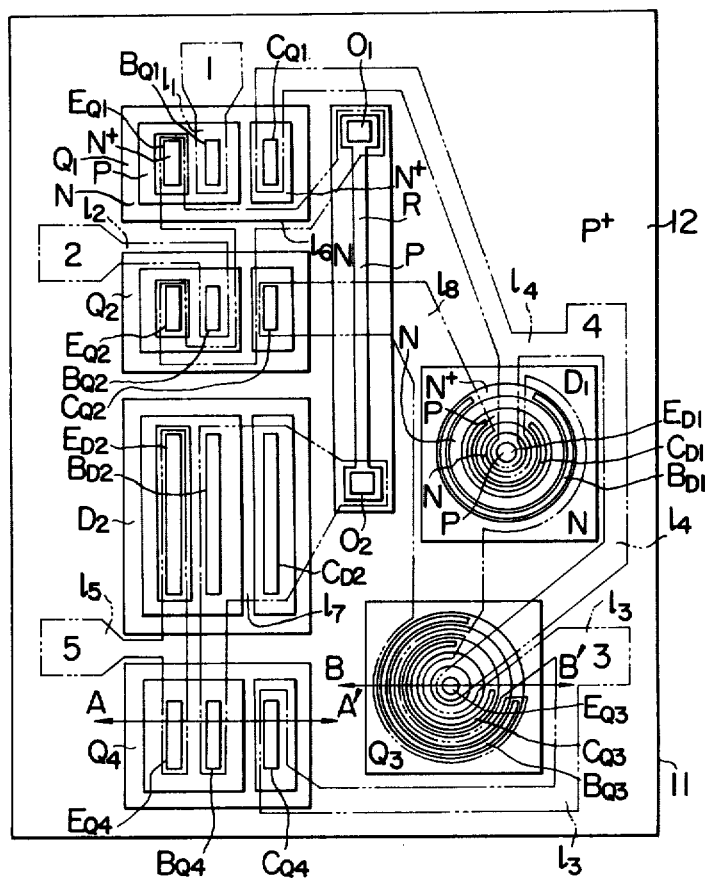
FIG. 3 is a structural view of a monolithic semiconductor integrated circuit embodying the differential amplifier of this invention.

Namely, the area of the operationally effective pn-junction of said first pn-junction diode $D_1$ is set substantially equal to that of the operationally effective pn-junction of said first transistor $Q_3$, while the operationally effective area of the pn-junction of said second pn-junction diode $D_2$ is set substantially equal to twice of that of the pn-junction of said second transistor $Q_4$. For illustrating this in more detail, a structure of the differential amplifier according to the embodiment of this invention shown in FIG. 1 formed in a monolithic semiconductor integrated circuit is shown in FIG. 3. In FIG. 3, transistors $Q_1$, $Q_2$, $Q_3$ and $Q_4$, diodes $D_1$ and $D_2$ and a resistor R are all formed in a single silicon semiconductor chip 11 and are electrically isolated from each other by the pn-isolation method with a p+ type isolation region 12. In the figure, thin solid lines indicate the shapes of the respective pn-junctions for forming the respective circuit elements in the monolithic semiconductor integrated circuit on the surface of a silicon semiconductor chip 11. Thick solid lines indicate apertured contact portions for exposing the silicon semiconductor chip 11 through a semiconductor surface passivating film such as a silicon oxide film formed on the chip surface. Broken lines indicate wiring electrodes of aluminium thin films formed on the semiconductor surface passivating film and numerals enclosed in broken lines indicate pins of the semiconductor integrated circuit.

Wiring $l_1$ forms an ohmic contact with the base contact portion $B_{Q1}$ of the npn-type transistor $Q_1$ and establishes the electric connection between the pin 1 and the base of the transistor $Q_1$. Wiring $l_2$ forms an ohmic contact with the base contact portion $B_{Q2}$ of the npn-type transistor $Q_2$ and forms the electric connection between the pin 2 and the base of the transistor $Q_2$. Wiring $l_3$ forms ohmic contacts with the collector contact portion $C_{Q3}$ of the pnp-type transistor $Q_3$ which has a lateral structure and with the collector contact portion $Q_{Q4}$ of the npn-type transistor $Q_4$ and forms the electric connection between the pin 3 and the collectors of the transistors $Q_3$ and $Q_4$. Wiring $l_4$ forms ohmic contacts with the collector contact portion $C_{Q1}$ of the npn-type transistor $Q_1$ and with the emitter contact portion $E_{D1}$ of the lateral pnp-type transistor $D_1$ serving as a diode and further with the emitter contact portion $E_{Q3}$ of the lateral pnp-type transistor $Q_3$, and establishes the electric connection among the pin 4, the collector of the transistor $Q_1$, the emitter of the lateral pnp-type transistor $D_1$ and the emitter of the lateral pnp-type transistor $Q_3$. Wiring $l_5$ forms ohmic contacts with the emitter contact portion $E_{D2}$ of the npn-type transistor $D_2$ serving as a diode and with the emitter contact portion $E_{Q4}$ of the npn-type transistor $Q_4$, and forms the electric connection among the pin 5, the emitter of the transistor $D_2$ and the emitter of the transistor $Q_4$. Wiring $l_6$ forms respective ohmic contacts with the emitter contact portion $E_{Q1}$ of the npn-type transistor $Q_1$, the emitter contact portion $E_{Q2}$ of the npn-type transistor $Q_2$ and the contact portion $Q_1$ at one end of the resistor R, and forms the electric connection among the emitters of the transistors $Q_1$ and $Q_2$ and the one end of the resistor R. Wiring $l_7$ firstly forms ohmic contacts with the base contact portion $B_{D2}$ and the collector contact portion $C_{D2}$ of the npn-type transistor $D_2$ and hence short-circuits the base and collector of this transistor $D_2$ to serve as the second diode means. Further, this wiring $l_7$ also forms ohmic contacts with the base contact portion $B_{Q4}$ of the npn-type transistor $Q_4$ and the contact portion $O_2$ at the other end of the resistor R. Therefore, this wiring $l_7$ forms the electric connection among the base and collector of the transistor $D_2$, the base of the transistor $Q_4$ and the other end of the resistor R. Similarly, wiring $l_8$ first forms ohmic contacts with the base contact portion $B_{D1}$ and the collector contact portion $C_{D1}$ of the lateral pnp-type transistor $D_1$ and short-circuits the base to the collector in this transistor $D_1$ to serve as the first diode means. This wiring $l_8$ also forms ohmic contacts with the collector contact portion $C_{Q2}$ of the npn-type transistor $Q_2$ and the base contact portion $B_{Q3}$ of the lateral pnp-type transistor $Q_3$. Therefore, this wiring $l_8$ forms the electric connection among the base and the collector of the transistor $D_1$, the base of the transistor $Q_3$ and the collector of the transistor $Q_2$.

Further, as shown in FIG. 3, the physical dimension (area) of the lateral structure pnp-type transistor $D_1$ arranged to serve as the first diode means of the first current source $CS_1$ is designed to be equal to that of the lateral structure pnp-type transistor $Q_3$ arranged to serve as the first transistor of the first current source $CS_1$. Particularly, the emitter-base junction areas of these lateral pnp-type transistors are designed to be equal. On the other hand, the physical dimensions (area) of the npn-type transistor $D_2$ arranged to serve as the second diode means in the second current source $CS_2$ is designed to be twice as large as that of the second transistor $Q_4$ in the second current source $CS_2$. Particularly, the emitter-base junction area of the transistor $D_2$ is twice as large as the emitter-base junction area of the transistor $Q_4$.

Figure 4:
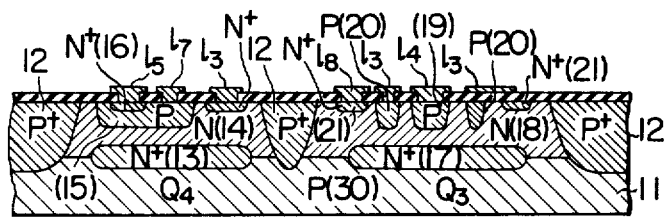
FIG. 4 is a partial cross-sectional view of the IC of FIG. 3.

FIG. 4 is a cross-section of the monolithic semiconductor integrated circuit of FIG. 3 along the lines AA' and BB' to show the cross-sectional view of the vertical npn-type transistor $Q_4$ and the lateral pnp-type transistor $Q_3$. The vertical, npn-type transistor $Q_4$ consists of an n+-type embedded region 13, an n-type collector region 14, a p-type base region 15, and an n+-type emitter region 16. Respective aluminium film wiring electrodes $l_5$, $l_7$ and $l_3$ are disposed to make ohmic contact with the emitter, base and collector regions. The lateral, pnp-type transistor $Q_3$ consists of an n+-type embedded region 17, an n-type base region 18, a p-type emitter region 19, a p-type collector region 20, an n+-type highly doped base region 21. Aluminium thin film wiring electrodes $I_4$, $I_3$ and $I_8$ are disposed to form ohmic contacts with these emitter region, collector region and highly doped base region, respectively.

According to the above embodiment of the present invention, the aforementioned objects can be achieved for the following reasons.

When two common mode signals of equal amplitude $\bar{v}$ are applied to the differential input terminals 1 and 2, respectively, a signal current $\bar{i}$ as expressed by the following equation is allowed to flow through the common resistor R.

$$\bar{i} = \bar{v}/(R + re + r_{D2}),$$

where, $R$ is the resistance of the common resistor R, re the resistance of the dynamic distribution resistance of the emitter, and $r_{D2}$ the resistance of the dynamic distribution resistance of the diode $D_2$.

When this signal current $\bar{i}$ is allowed to flow through the common resistor R, signal current $\bar{i}/2$ equal to a half of said signal current $\bar{i}$ is allowed to flow through each of said differential pair transistors $Q_1$ and $Q_2$ since the voltage versus current characteristics between the base and the emitter of the differential pair transistors $Q_1$ and $Q_2$ are substantially equal to each other.

This signal current $\bar{i}/2$ is allowed to flow further through the pnp-type transistor $D_1$ serving as the first diode means to bias the base-emitter junction thereof and generate a biasing voltage. The base-emitter junction of the first transistor $Q_3$ in the first current source $CS_1$ is then biased by this voltage. Since the emitter-base junction areas of the transistors $D_1$ and $Q_3$ are arranged to be equal to each other, a signal current of $\bar{i}/2$ is allowed to flow out from the collector of the first transistor $Q_3$ to the pin 3.

On the other hand, the signal current $i$ through the common resistor R is allowed to flow through the npn-type transistor $D_2$ which serves as the second diode means to bias the base-emitter junction thereof and generate a biasing voltage. This biasing voltage then biases the base-emitter junction of the second transistor $Q_4$ in the second current source $CS_2$. Since the emitter-base junction area of the transistor $Q_4$ is set equal to a half of that of the transistor $D_2$, a current signal $i/2$ equal to a half of the signal current $i$ is allowed to flow from the pin 3 to the collector of the second transistor $Q_4$.

Therefore, since the signal current $i/2$ from the first transistor $Q_3$ and the signal current $i/2$ from the second transistor $Q_4$ have equal magnitude and opposite phase, they cancel out each other and no signal current is generated at the output terminal (pin 3) by any common mode signals applied to the differential input terminals. Hence, an excellent common mode signal rejection ratio (CMRR) can be obtained.

Further, in such an embodiment of this invention, such constant current source circuits which are used for obtaining an excellent CMRR do not require many circuit elements, and hence the number of circuit elements constituting the circuit can be reduced by two compared to the conventional case. Namely, in this invention, seven circuit elements, i.e., four transistors, two diodes and one resistor are used.

The present invention is not limited to the above embodiment and various modifications and alternations are possible.

Figure 2:
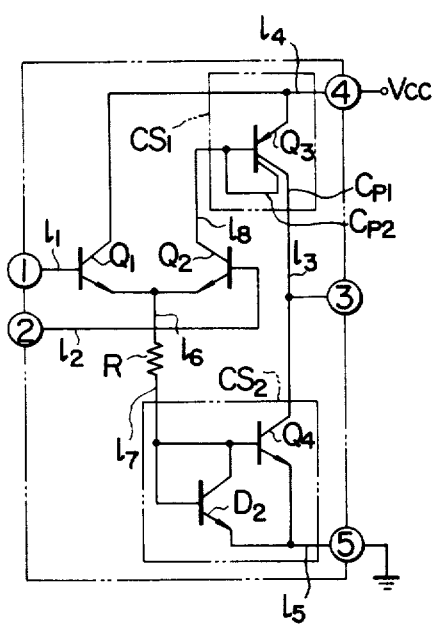
Figure 5:
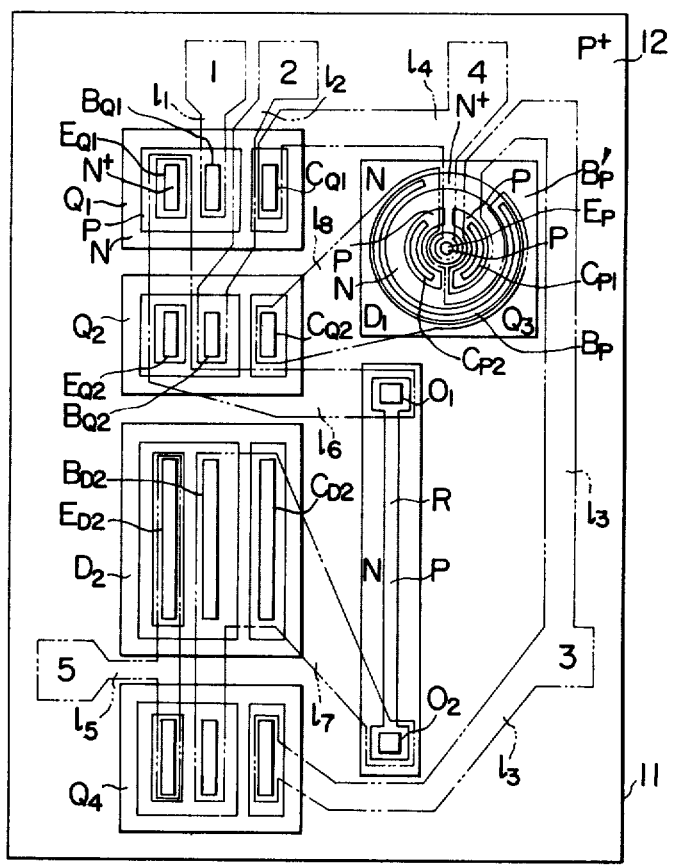
FIG. 5 is a structural view of a monolithic semiconductor integrated circuit embodying the differential amplifier of FIG. 2 according to this invention.

FIG. 2 shows the circuit diagram of a differential amplifier according to the second embodiment of the present invention. Compared to the embodiment of FIG. 1, the amplifier circuit of FIG. 2 has such a first current source $CS_1$ which includes a multi-collector, lateral pnp-type transistor $Q_3$. This multi-collector, lateral pnp-type transistor $Q_3$ has one collector $C_{P2}$ short-circuited to the base thereof and connected to the collector of one transistor $Q_2$ of the differential pair transistors. Thus, this becomes equivalent to the connection of the first diode means between the first power supply terminal (pin 4) and the collector of the transistor $Q_2$. Further, the base-collector junction areas of the two collectors $C_{P1}$ and $C_{P2}$ of this multi-collector, lateral pnp-type transistor $Q_3$ are designed to be equal to each other, and, similar to the case of the embodiment of FIG. 1, the emitter-base junction area of the transistor $D_2$ is designed to be twice as large as that of the transistor $Q_4$. A structural view of the differential amplifier according to this embodiment of FIG. 2 adapted in a monolithic semiconductor integrated circuit is shown in FIG. 5, in which it will be seen that the first current source $CS_1$ is formed of a multi-collector, lateral pnp-type transistor including a first diode means $D_1$ and a first transistor. This multi-collector transistor has an emitter contact portion $E_p$ disposed in a p-type emitter region which is disposed at a central portion of an n-type base region $B_p'$, collector contact portions $C_{P1}$ and $C_{P2}$ disposed in two p-type collector regions, respectively, which are disposed around said p-type emitter region, and a base contact portion $B_p$ disposed in the n+-type highly doped base region which is disposed in a peripheral portion. Further, two base-collector junction areas formed between said two p-type collector regions and the n-type base region are made of equal size. The emitter contact portion $E_p$ forms an ohmic contact with the wiring $I_4$, one collector contact portion $C_{P1}$ with the wiring $I_3$, and the other collector contact portion $C_{P2}$ and the base contact portion $B_p$ both with the wiring $I_8$ and with the collector contact portion $C_{Q2}$ of the transistor $Q_2$.

According to such an embodiment, substantially equal currents are allowed to flow on the one hand through the emitter contact portion $E_p$, the collector contact portion $C_{P2}$ and the base contact portion $B_p$ of the multi-collector transistor which in combination serve as the first diode means and on the other hand through the emitter contact portion $E_p$ and the collector contact portion $C_{P1}$ of the multi-collector transistor which in combination serve as the first transistor means. Therefore, this embodiment achieves the aforementioned objects similar to the first embodiment shown in FIGS. 1 and 3.

Figure 6:
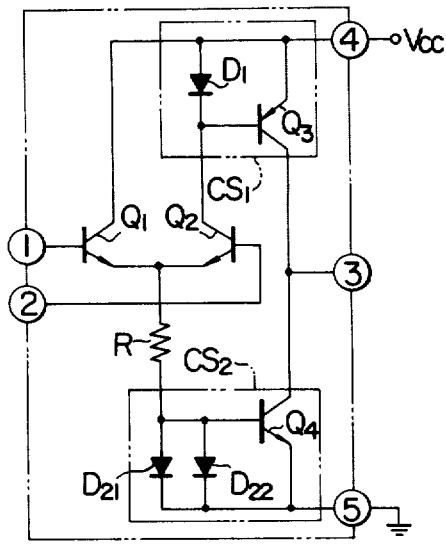
FIGS. 6, 7 and 8 are circuit diagrams of the differential amplifier according to the third, fourth and fifth embodiments of this invention.
Figure 7:
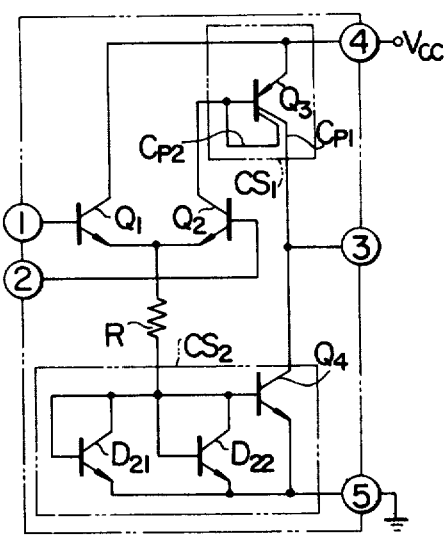

FIGS. 6 and 7 show circuit diagrams of differential amplifier circuits according to the third and the fourth embodiments which are respective modifications of the first and second embodiments. Namely, the structure of the second diode of the second current source $CS_2$ is modified. The second diode means consists of a parallel connection of two diodes $D_{21}$ and $D_{22}$ each of which has a pn-junction area substantially equal to the base-emitter junction area of the second transistor $Q_4$.

Figure 8:
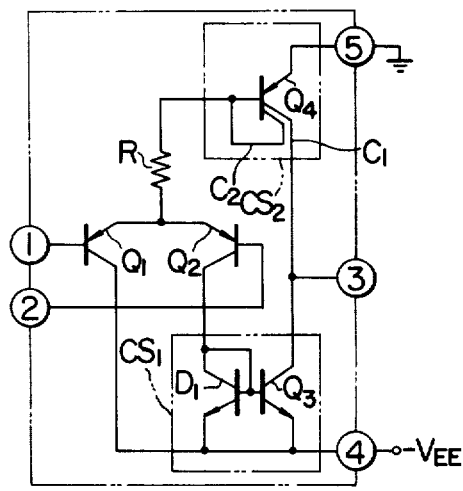

FIG. 8 shows a circuit diagram of the differential amplifier according to the fifth embodiment, which employs a negative voltage power source ($-V_{EE}$). Thus, the differential pair transistors $Q_1$ and $Q_2$ are lateral pnp-type transistors, the first diode means $D_1$ and the first transistor $Q_3$ are npn-type transistors and the second current source $CS_2$ is formed of a multi-collector lateral pnp-type transistor. Further, the emitter-base junction area of this transistor $D_1$ is designed to be equal to the emitter-base junction area of the transistor $Q_3$. On the other hand, this multi-collector lateral pnp-type transistor $Q_4$ has a first collector $C_1$ and a second collector $C_2$, the base-collector junction area of the second collector $C_2$ being twice as large as the base-collector junction area of the first collector $C_1$. Further, since the second collector $C_2$ is shortcircuited to the base of the pnp-type transistor $Q_4$, as an equivalent circuit a second diode $D_2$ having a pn-junction area twice as large as the emitter-base junction area of the transistor $Q_4$ is connected between the emitter and the base of the transistor $Q_4$ in the forward direction. Thus, this embodiment also achieves the aforementioned objects similar to the above embodiments.

Figure 9:
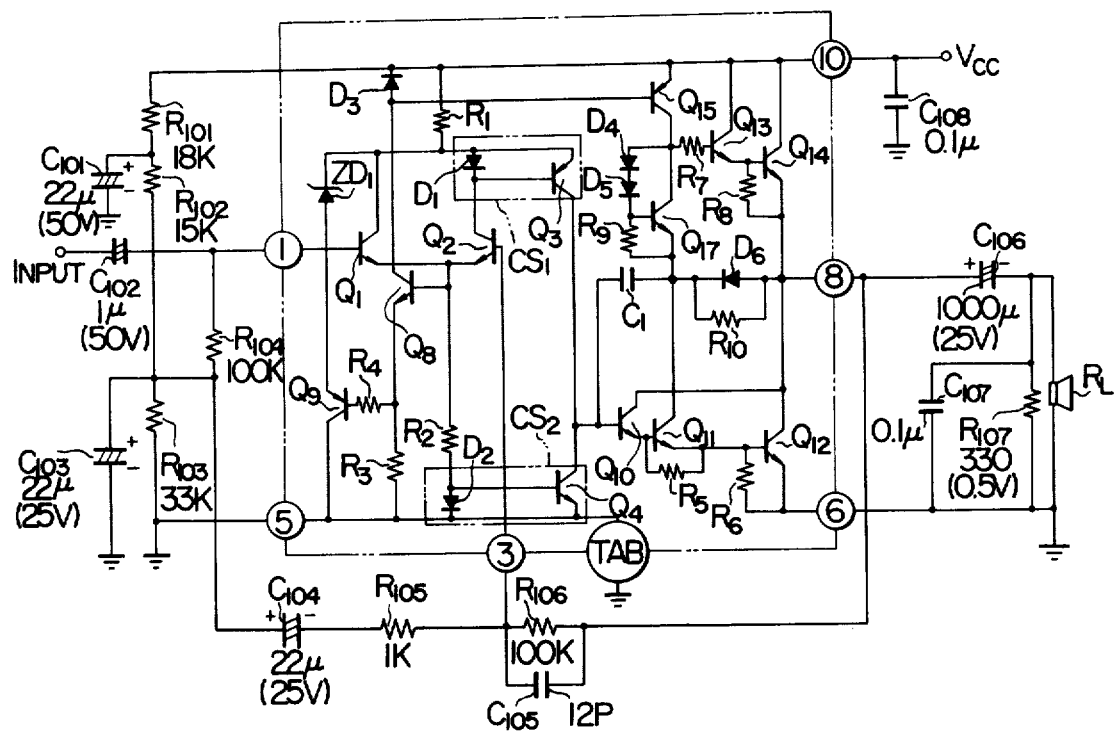
FIG. 9 is a circuit diagram of an audio use high output power amplifier circuit embodying the differential amplifier of this invention at the initial stage.
Figure 10:
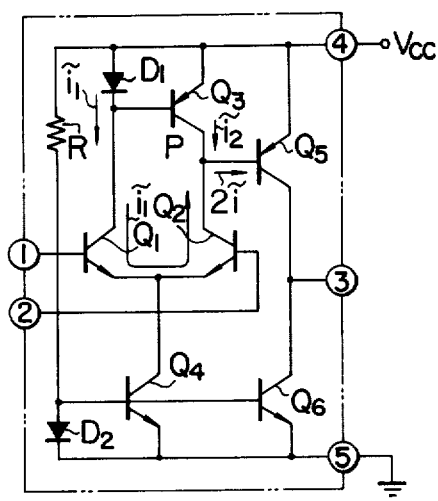
FIG. 10 is a circuit diagram of a conventionally known differential amplifier.
Figure 11:
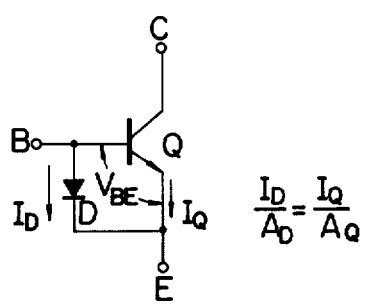
FIG. 11 is a circuit diagram of the current source circuit shown in FIG. 10.

FIG. 9 shows an embodiment of the differential amplifier of the present invention utilized as the first stage amplifier of an acoustic high output power amplifier formed in a monolithic semiconductor integrated circuit. In this circuit, an input signal applied to the pin 1 is amplified in this preamplifier stage and supplied to the push-pull output power amplifier stage including amplifying transistors $Q_{10}$ to $Q_{14}$.

Various embodiments of this invention have been described hereinabove, but this invention is not limited to the above embodiments. For example, the differential pair transistors $Q_1$ and $Q_2$ of this invention are not limited to the bipolar type transistors but may be formed of such amplifying elements which have an input electrode, a grounded electrode and an output electrode such as a MOS type field effect transistor or a junction-type field effect transistor.

We claim:

1. A differential amplifier comprising a pair of differential amplifying elements each having an input electrode, a ground electrode and an output electrode, a first power supply terminal, a second power supply terminal, a common impedance means, a first current source means including a first diode means and a first transistor of a first conductivity type, a second current source means including a second diode means and a second transistor means of a second conductivity type, and an output terminal, the ground electrodes of said two differential amplifying elements being connected in common to one end of said common impedance means, said second diode means being connected between the other end of said common impedance means and said second power supply terminal, said second transistor having a base and an emitter connected to the other end of said common impedance means and the second power supply terminal, respectively, said first diode means being connected between said first power supply terminal and the output electrode of one of said two differential amplifying elements, said first transistor having a base and an emitter connected to the output electrode of said one of the two differential amplifying elements and said first power supply terminal, respectively, said output terminal being connected to the collectors of said first and second transistors and deriving a differential output signal current of the two signals applied to the respective input electrodes of said two differential amplifying elements, the operationally effective pn-junction area of said first diode means being selected substantially equal to that of said first transistor, and the operationally effective pn-junction area of said second diode means being selected substantially equal to twice of that of said second transistor.

2. A differential amplifier according to claim 1, wherein the first diode means of said first current source means is a transistor of a first conductivity type having a base and a collector connected to each other and the second diode means of said second current source means is a second conductivity type transistor having a base and a collector connected to each other.

3. A differential amplifier according to claim 2, wherein the first conductivity type transistor constituting the first diode means of said first current source means has an operationally effective pn-junction area limited by the emitter-base junction area of said first conductivity type transistor, the second conductivity type transistor constituting the second diode means of said second current source means has an operationally effective pn-junction area limited by the base-emitter junction area of said second conductivity type transistor, said first transistor has an operationally effective pn-junction area limited by the emitter-base junction area of said first transistor and said second transistor has an operationally effective pn-junction area limited by the emitter-base junction area of said second transistor.

4. A differential amplifier according to claim 3, wherein the first transistor of said first current source means and the first conductivity type transistor having the base and the collector connected to each other and constituting the first diode means are respectively formed of lateral pnp-type transistors in an integrated circuit, and the second transistor of said second current source means and the second conductivity type transistor having the base and the collector connected to each other and constituting the second diode means are respectively formed of vertical npn-type transistors of the integrated circuit.

5. A differential amplifier according to claim 1, wherein the first diode means of said first current source means and the first transistor are formed of a multicollector lateral pnp-type transistor in an integrated circuit having at least two collectors, said first diode means being equivalently formed by the electric connection of one of the collectors and the base of said multi-collector lateral pnp-type transistor, the second diode means of said second current source is a transistor of the second conductivity type having a base and a collector connected to each other, the second conductivity type transistor constituting the second diode means of said second current source and the second transistor are respectively formed of vertical npn-type transistors in the integrated circuit, the first diode means of said first current source having an operationally effective pn-junction area defined by the base-collector junction area of said multi-collector lateral pnp-type transistor formed between one of the collectors and the base, said first transistor having an operationally effective pn-junction area defined by the base-collector junction area of said multi-collector lateral pnp-type transistor formed between the other of the collectors and the base, and the second transistor and the second conductivity type transistor of said second current source means have respective operationally effective pn-junction areas defined by the respective emitter-base junction areas.

6. A differential amplifier according to claim 1, wherein said first diode means is a transistor of the first conductivity type having a collector and a base connected to each other, and the first transistor of said first current source and the first conductivity type transistor constituting the first diode means are respectively formed of vertical npn-type transistors in an integrated circuit, the second diode means and the second transistor of said second current source means are formed of a multi-collector lateral pnp-type transistor in the integrated circuit having at least two collectors, said second diode means being equivalently formed of the electric connection of one of the collectors and the base of said multi-collector lateral pnp-type transistor, the first transistor and the first conductivity type transistor of said first current source means have the respective operationally effective pn-junction areas defined by the respective emitter-base junction areas, the second diode means of said second current source means having an operationally effective pn-junction area defined by the base-collector junction area of said multi-collector lateral pnp-type transistor formed between one of the collectors and the base, and said second transistor having an operationally effective pn-junction area defined by the base-collector junction area of said multi-collector lateral pnp-type transistor formed between the other of the collectors and the base.

7. A differential amplifier according to claim 4, wherein said two differential amplifying elements are respectively formed of vertical npn-type transistors in the integrated circuit.

8. A differential circuit formed in a monolithic semiconductor substrate, comprising:
- a pair of differential amplifying elements each having an input electrode, an output electrode and another electrode connected to that of the other element;
- a common diode means connected in common to said another electrode of each amplifying element;
- another diode means connected to the output electrode of one of said amplifying elements;
- one transistor means having a control electrode connected to one end of said common diode means to allow the passage of a current of half the magnitude of that through said common diode means;
- another transistor means having a control electrode connected to one end of said another diode means to allow the passage of a current of equal magnitude as that through said another diode means; and
- an output terminal connected to output electrodes of said one and another transistor means connected in common.

9. A differential amplifier integrated circuit formed in a monolithic semiconductor substrate, comprising a pair of differential amplifying elements each having an input electrode, a ground electrode and an output electrode, a first power supply terminal, a second power supply terminal, a common impedance means, a first current source means including a first diode means and a first transistor of a first conductivity type, a second current source means including a second diode means and a second transistor means of a second conductivity type, and an output terminal, the ground electrodes of said two differential amplifying elements being connected in common to one end of said common impedance means, said second diode means being connected between the other end of said common impedance means and said second power supply terminal, said second transistor having a base and an emitter connected to the other end of said common impedance means and the second power supply terminal, respectively, said first diode means being connected between said first power supply terminal and the output electrode of one of said two differential amplifying elements, said first transistor having a base and an emitter connected to the output electrode of said one of the two differential amplifying elements and said first power supply terminal, respectively, said output terminal being connected to the collectors of said first and second transistors and deriving a differential output signal current of the two signals applied to the respective input electrodes of said two differential amplifying elements, the operationally effective pn-junction area of said first diode means being selected substantially equal to that of said first transistor, and the operationally effective pn-junction area of said second diode means being selected substantially equal to twice of that of said second transistor.

* * * * *